United States Patent [19]
Stein et al.

[11] Patent Number: 5,964,943
[45] Date of Patent: *Oct. 12, 1999

[54] METHOD OF PRODUCING BORON-DOPED MONOCRYSTALLINE SILICON CARBIDE

[75] Inventors: René Stein, Röttenbach; Roland Rupp, Lauf, both of Germany

[73] Assignee: Siemens Aktiengesellschaft, Munchen, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/860,434

[22] PCT Filed: Dec. 13, 1995

[86] PCT No.: PCT/DE95/01787

§ 371 Date: Jun. 25, 1997

§ 102(e) Date: Jun. 25, 1997

[87] PCT Pub. No.: WO96/20298

PCT Pub. Date: Jul. 4, 1996

[30] Foreign Application Priority Data

Dec. 27, 1994 [DE] Germany ............................. 44 46 866
Feb. 13, 1995 [DE] Germany ............................ 195 04 669

[51] Int. Cl.$^6$ ................................................ C30B 25/16
[52] U.S. Cl. .............................. 117/88; 117/89; 117/109; 117/951; 427/58; 427/249; 427/255.1; 427/255.2; 427/573.2
[58] Field of Search ............................. 427/58, 249, 255, 427/255.1, 255.2, 376.2; 17/88, 89, 109, 951

[56] References Cited

U.S. PATENT DOCUMENTS

| | | |
|---|---|---|
| 4,547,404 | 10/1985 | Campbell et al. ................... 427/248.1 |
| 4,767,336 | 8/1988 | Yamazaki ..................................... 437/2 |
| 4,784,874 | 11/1988 | Ishihara et al. ........................... 427/49 |
| 4,812,325 | 3/1989 | Ishihara et al. ........................... 427/69 |
| 4,853,251 | 8/1989 | Ishihara et al. ............................ 427/38 |
| 4,912,064 | 3/1990 | Kong et al. .............................. 437/100 |
| 4,923,716 | 5/1990 | Brown et al. ........................... 427/249 |
| 4,941,942 | 7/1990 | Bruns et al. ............................ 156/657 |
| 4,975,299 | 12/1990 | Mir et al. ................................. 427/51 |
| 5,135,607 | 8/1992 | Hirai ....................................... 156/643 |

FOREIGN PATENT DOCUMENTS

| | | |
|---|---|---|
| 1045115 | 2/1989 | Japan . |
| 2-34783 | 2/1990 | Japan . |
| 0 554 047 | 8/1993 | WIPO . |
| 0 573 033 A1 | 12/1993 | WIPO . |

OTHER PUBLICATIONS

"Production of large–area single–crystal wafers of cubic SiC for semiconductor devices", Nishino, S. et al., Appl. Phys. Lett., vol. 42, No. 5, (1983), pp. 460–462.

"Theoretical and empirical studies of impurity incorporation into β–SiC thin films during epitaxial growth", Kim, H. J. et al., J. Electrochem. Soc., vol. 133, No. 11, (1986), pp. 2350–2357.

"Boron doped a–SiC$_x$: H films from B $(C_2H_5)_3$/SiH$_4$", Suchanek, G. et al., Physika B, 170 (1991), pp. 574–576.

"Environmentally nonpolluting boron doping of a–Si$_{1-x}$ C$_x$: H with a liquid boron source", Suchaneck, G. et al., Journal of non–crystalline solids, 137 & 138 (1991) pp. 701–704.

"High quality p–type a–SiC film doped with B $(CH_3)_3$ and its application to a–Si solar cells", Kuwano, Y. et al, Mat. Res. Soc. Symp. Proc., vol. 118, (1988), pp. 557–559.

"Refractive index and absorption in boron–doped a–SiC:H using either diborane or trimethylboron as a doping gas", Gorn, M. et al., Philosophical magazine B, vol. 64, No. 1, (1991), pp. 101–111.

*Primary Examiner*—Robert Kunemund
*Attorney, Agent, or Firm*—Kenyon & Kenyon

[57] ABSTRACT

A CVD process or a sublimation process for doping an SiC monocrystal uses an organic boron compound whose molecules contain at least one boron atom chemically bonded to at least one carbon atom. Boron trialkyls are preferred organic boron compounds.

17 Claims, No Drawings

METHOD OF PRODUCING BORON-DOPED MONOCRYSTALLINE SILICON CARBIDE

BACKGROUND OF THE INVENTION

The invention concerns a method of producing boron (B)-doped monocrystalline silicon carbide.

In addition to aluminum, boron is the most important dopant for p-type doping of monocrystalline SiC semiconductor material.

In *Applied Physics Letters*, vol. 42, no. 5, Mar. 1, 1983, pages 460–462, a process is disclosed for producing a boron-doped layer of monocrystalline silicon carbide (SiC) of the 3C polytype (β-SiC) by chemical vapor deposition (CVD) on a monocrystalline silicon substrate at a temperature of 1400° C. In this known process, hydrogen ($H_2$) is used as the carrier gas, silane ($SiH_4$) is used as the precursor for supplying silicon (Si) with a molar amount of 0.04% in the $H_2$ carrier gas, and propane ($C_3H_8$) with a molar amount of 0.02% in $H_2$ is used as the precursor to supply carbon (C). The doping gas diborane ($B_2H_6$) is added to the gas mixture of the carrier gas and the two precursors in the amount of 100 ppm in $H_2$ for doping. The deposited β-SiC layer has a charge carrier concentration of holes (p-type conduction) of $5.6 \cdot 10^{14}$ to $1.6 \cdot 10^{15}$ $cm^{-3}$.

In another process disclosed in *Journal of the Electrochemical Society*, vol. 133, no. 11, November 1986, pages 2350–2357, a boron-doped β-SiC layer is produced by CVD epitaxy at a temperature of 1360° C. with silane ($SiH_4$) and ethene ($C_2H_4$) as precursors, hydrogen ($H_2$) as the carrier gas and diborane ($B_2H_6$) as the doping gas. With an SiC layer produced by this known method, only a small portion (0.2%) of the boron atoms introduced into the SiC are electrically active. To achieve a high charge carrier concentration of the p-type conduction, the atomic concentration of boron in SiC must therefore be so high that the surface quality of the growing SiC layer is greatly impaired.

U.S. Pat. No. 4,923,716 discloses another CVD process for producing boron-doped β-SiC with diborane as the doping gas.

Furthermore, sublimation processes are also known for producing monocrystalline SiC where an SiC bulk crystal of sublimed SiC is grown in the vapor phase (mainly Si, $Si_2C$, $SiC_2$) on the wall of a vessel (Lely process) or on a seed crystal (modified Lely process).

Furthermore, plasma-assisted CVD process are also known for deposition of a boron-doped amorphous compound of silicon and carbon, a-$Si_{1-x}C_x$:H, with hydrogen inclusions on a substrate. For doping the a-$Si_{1-x}C_x$:H layer with boron, an organic boron compound with an unsaturated hydrocarbon residue or boron trimethyl or boron triethyl is added to a precursor containing hydrogen gas and silane. The deposition temperatures on the substrate are between 150° C. and a maximum of 300° C. The optical energy gap of the a-$Si_{1-x}C_x$:H layer is adjusted through the boron doping. Such a-$Si_{1-x}C_x$:H layers are used as p-type layers in a p-i-n solar cell based on amorphous silicon. The amount of silicon in these known a-$Si_{1-x}C_x$:H layers is much greater than the amount of carbon (European Patent A 573,033 or *Patent Abstracts of Japan*, C-711, Apr. 19, 1990, vol. 14, no. 192 or *Physica B*, no. 170 (1991) pp. 574–576 or *Journal of Non-Crystalline Solids*, no. 137+138 (1991) pp. 701–704 or *Materials Research Society Symposium Proceedinqs*, vol. 118 (1988) pp. 557–559 or *Philosophical Magazine B*, vol. 64, no. 1 (1991) pp. 101–111). Monocrystalline SiC layers cannot be produced by these known methods.

SUMMARY OF THE INVENTION

The object of this invention is to provide a process for producing boron-doped monocrystalline silicon carbide, where the boron atoms incorporated into the silicon carbide crystal lattice have a high degree of activation.

DETAILED DESCRIPTION OF THE INVENTION

This object is achieved according to this invention with the features of Claim 1 or with the features of Claim 5.

In a CVD process for producing p-type boron-doped monocrystalline SiC, at least one precursor is used to supply silicon (Si) and carbon (C) and at least one organic boron compound is used for doping according to Claim 1. Each molecule of the at least one organic boron compound has at least one boron atom that is chemically bonded to at least one carbon atom. In the monocrystalline SiC layer grown on a substrate by this CVD method, definitely more boron atoms are electrically activated than with the boron-doped SiC layers obtained by the known methods. The ratio of charge carrier concentration of the holes (p-type conduction) to the chemical atomic concentration of boron atoms in the crystal lattice of the SiC layer is thus higher and may even be almost 1.

In a sublimation process according to Claim 5, solid silicon carbide (SiC) is at least partially sublimed, and monocrystalline SiC is formed from the sublimed silicon carbide in the vapor phase. At least one organic boron compound is used for doping the crystallizing SiC monocrystals. Each molecule of the at least one organic boron compound contains at least one boron atom chemically bonded to at least one carbon atom.

Boron atoms (B atoms) may be incorporated into the SiC crystal lattice as imperfections at silicon (Si) lattice sites, carbon (C) lattice sites or interlattice sites. One boron atom at an Si lattice site is electrically active and forms an acceptor energy level between about 250 meV and 350 meV in the 4H polytype of SiC and between about 300 meV and 350 meV in the 6H polytype of SiC. However, this acceptor level is comparatively low, so a maximum of only about 1% of the boron atoms in the SiC crystal are thermally ionized at room temperature. The electric activity of boron atoms at C lattice sites has not yet been completely elucidated. Perhaps the boron at these C lattice sites forms a low energy level whose contribution to the conductivity (donor or acceptor) has not yet been elucidated. However, it may be assumed that boron atoms at interlattice sites in the SiC crystal are essentially not electrically active.

This invention is based on the finding that when using organic boron compounds as dopants, the boron in the vapor phase in the molecules of the boron compound is chemically bonded to at least one vicinal carbon atom. Thus the incorporation of boron atoms at Si lattice sites in the SiC crystal lattice is greatly facilitated. However, boron atoms incorporated at Si lattice sites have the above-mentioned imperfection energy levels which contribute to the p-type conduction as acceptor levels. This explains the high degree of activation of the boron imperfections incorporated into the SiC crystal layer by the process according to this invention.

The process according to this invention can be used to produce in particular α-SiC of the 4H or 6H polytype, for example, with a p-type charge carrier concentration of preferably about $10^{15}$ $cm^{-3}$ to about $5 \cdot 10^{19}$ $cm^{-3}$.

Advantageous embodiments and refinements of this process are derived from the claims dependent upon Claim 1 and Claim 5.

One embodiment uses an organic boron compound whose molecules have at least one branched or unbranched chain (aliphatic) hydrocarbon residue, such as an alkyl group or an unsaturated hydrocarbon group with double and/or triple bonds between at least some of its carbon atoms.

In another embodiment, the organic boron compound has at least one ring hydrocarbon residue, e.g., a cycloalkyl group or an aromatic hydrocarbon group.

In an especially advantageous embodiment, at least one boron atom is surrounded by three carbon atoms in a generally tetrahedral bond in the molecules of the organic boron compound. Examples of such dopant substances include boron trialkyls such as boron trimethyl, boron triethyl, boron tripropyl, boron tributyl or boron tripentyl in all isomeric forms or aromatic compounds such as boron triphenyl. The bonding of the boron atom in this embodiment in the vapor phase corresponds to the subsequent bonding at an Si lattice site in the SiC crystal. This facilitates the incorporation of boron atoms at Si lattice sites in particular.

The hydrogen atoms in the hydrocarbon residues of the organic boron compound may also be at least partially substituted, in particular by halogen atoms.

Finally, organic boron compounds with several boron atoms in their molecules may also be used, in particular dimeric or trimeric boron compounds where two or three boron atoms are chemically bonded to each other. Then each boron atom is preferably bonded to at least one vicinal carbon atom.

The organic boron compound is directed toward the developing monocrystalline SiC, preferably with a carrier gas. A bubbling process may be used with liquid boron compounds, such as the above-mentioned boron triethyl, boron tripropyl and boron tributyl. In the bubbling process, the liquid boron compound is poured into a container (cryostat) and the carrier gas is passed through the liquid and thereby enriched with boron. The boron-enriched carrier gas is used for supplying boron to the growing SiC monocrystal. The boron concentration in this carrier gas enriched with the organic boron compound may optionally be further reduced by diluting with additional carrier gas. The preferred carrier gas is hydrogen ($H_2$). However, a noble gas such as argon (Ar) or a mixture of a noble gas and hydrogen may also be used as the carrier gas.

The vapor pressure of the liquid boron compound is preferably adjusted to a predetermined level by adjusting the temperature. Typically the temperature in the liquid boron compound is between about −50° C. and about +30° C. The boron dopant concentration in the growing SiC monocrystal can be adjusted through the vapor pressure of the liquid organic boron compound.

The boron dopant concentration in the SiC monocrystal can also be adjusted via the flow rate of the carrier gas in bubbling through the liquid organic boron compound. Typical flow rates for the bubbling carrier gas are between about 1 and 100 ml/min. The flow rate of the carrier gas can be adjusted with great accuracy with the help of a mass flow controller, for example.

In the case of gaseous organic boron compounds, the boron compound is supplied to the growing SiC monocrystal either directly or diluted with a carrier gas.

In principle, any gas suitable for supplying Si and C in the vapor phase may be used as the precursor (process gas) for the CVD process. In an advantageous embodiment, a precursor mixture of at least one precursor containing silicon but no carbon, e.g., silane or disilane, and at least one precursor containing carbon but no silicon, e.g., a hydrocarbon gas such as methane, propane or acetylene (ethyne) is used. The C/Si ratio of carbon to silicon in the gas phase can be adjusted in this way. Preferred precursors in this embodiment include silane ($SiH_4$) for supplying silicon (Si) and propane ($C_3H_8$) for supplying carbon in the vapor phase. However, a precursor containing both silicon and carbon may also be used, such as the substance 1,3-dimethyl-3-methylsilamethylenedisilacyclobutane or methylsilane.

In an especially advantageous embodiment, the precursors contain an excess of carbon. Then the C/Si ratio is more than 1 in particular and less than approx. 10 in particular, preferably approx. 4. Due to the excess carbon in the precursor mixture, the void concentration of Si lattice sites is increased. This greatly facilitates the incorporation of boron atoms at Si lattice sites.

In the CVD process in general, the precursor or precursor mixture is diluted with a carrier gas, typically in a ratio between approx. 1:35 and approx. 1:100. Hydrogen ($H_2$) is the preferred carrier gas for the at least one precursor. The ratio of silane to hydrogen can be adjusted between approx. $2 \cdot 10^{-5}$ and $5 \cdot 10^{-5}$. However, a noble gas such as argon or a mixture of hydrogen and a noble gas may also be used as the carrier gas.

The mixture of precursors, organic boron compound and carrier gases is then preferably conveyed into a recipient or combined there in the CVD process. At least one substrate is provided in the recipient. The boron-doped SiC layer is grown on a crystallization surface of the substrate by chemical vapor deposition from the gas mixture. All materials suitable for chemical vapor deposition of SiC may be used for the substrates, including silicon and sapphire, but preferably SiC of a certain polytype such as 4H or 6H.

The growth temperatures at the crystallization surface of the substrate for the CVD process are generally set between 1000° C. and 2200° C., and for producing α-SiC, specifically of the 4H or 6H polytype, the temperature is generally set between 1500° C. and 2200° C., preferably between 1500° C. and 1700° C.

The amount of organic boron compound in the gas is preferably between $10^{-8}$ and $10^{-6}$. The total gas pressure in the recipient is generally set between approx. 100 Pa and $2 \cdot 10^4$ Pa, preferably between and approx. $2 \cdot 10^4$ Pa and $10^5$ Pa. When silane is the precursor, the ratio of organic boron compound to silane is preferably between approx. $10^{-6}$ and $10^{-3}$.

With the CVD process according to this invention, boron-doped monocrystalline SiC epitaxial layers can be produced, where the boron atom concentration increases essentially in proportion (linearly) to the gas partial pressure of the organic boron compound on the substrate in the recipient, from approx. $10^{16}$ cm$^{-3}$ at an organic boron compound partial pressure of $10^{-3}$ Pa ($10^{-8}$ bar) up to approx. $10^{20}$ cm$^{-3}$ at an organic boron compound partial pressure of approx. 1 Pa (10−5 bar). Thus, the boron atom concentration can be adjusted accurately over a wide range.

In the sublimation process, the mixture of sublimed SiC in the vapor phase, organic boron compound and optional carrier gases is preferably introduced into a susceptor made of a heat-resistant material or they are combined there. Crystallization of the SiC monocrystal with boron doping takes place in the susceptor. In an advantageous embodiment of the sublimation process, the boron-doped SiC monocrystal is grown on a crystallization surface of a seed crystal arranged in the susceptor. All materials suitable for vapor-phase deposition of SiC can be used as the seed crystal, preferably SiC of a specific polytype such as 4H or 6H or 3C. The seed crystal is preferably arranged in the susceptor.

The growth temperatures at the crystallization surface of the seed crystal in the sublimation process are generally between 1800° C. and 2500° C., preferably between 2100° C. and 2300° C. In principle, all polytypes of SiC can be produced by this sublimation process.

What is claimed is:

1. A process for producing monocrystalline silicon carbide doped with boron by chemical vapor deposition on a substrate, comprising the steps of:
   a) supplying silicon and carbon by conveying at least one precursor into a recipient,
   b) supplying boron by conveying at least one organic compound whose molecules contain at least one carbon atom chemically bonded to at least one boron atom into a recipient,
   c) setting a crystallization surface of the substrate to at least 1000° C.,
   d) forming a gas phase comprising the supplied silicon and carbon,
   e) establishing an excess of carbon compared to silicon in the gas phase, and
   f) growing monocrystalline silicon carbide on the crystallization surface from the at least one precursor and the at least one organic compound.

2. The process according to claim 11, wherein at least one silicon compound that does not contain carbon is used as the precursor to supply silicon and at least one carbon compound that does not contain silicon is used as the precursor to supply carbon.

3. The process according to claim 11, wherein the organic boron compound is related to a predetermined partial pressure, said partial pressure being set on the substrate between approximately $10^{-3}$ Pa and 1 Pa.

4. A process for producing monocrystalline silicon carbide doped with boron, comprising the steps of:
   a) at least partially subliming silicon carbide in its solid form,
   b) forming monocrystalline silicon carbide from the sublimed silicon carbide being in the vapor phase, and
   c) supplying boron using at least one organic boron compound whose molecules contain at least one carbon atom chemically bonded to at least one boron atom.

5. The process according to claim 4, wherein monocrystalline silicon carbide is grown on a seed crystal.

6. The process according to claim 1, wherein the organic boron compound comprises a boron trialkyl or an aromatic compound.

7. The process according to claim 1, wherein the molecules of the organic boron compound contain at least one halogen atom.

8. The process according to claim 1, wherein the molecules of the organic boron compound contain at least two boron atoms, each of which is chemically bonded to at least one carbon atom.

9. The process according to claim 1, wherein at least one carrier gas is passed through the organic boron compound and the carrier gas enriched with the organic boron compound is supplied to a developing monocrystalline silicon carbide.

10. The process according to claim 9, wherein hydrogen is used as the carrier gas.

11. The process according to claim 9, wherein at least one noble gas is used as the carrier gas.

12. The process according to claim 9, wherein a gas mixture of hydrogen and at least one noble gas is used as the carrier gas.

13. The process according to claim 9, wherein the concentration of dopant for boron in the monocrystalline silicon carbide is adjusted by adjusting the flow rate of carrier gas through the organic boron compound.

14. The process according to claim 1, wherein the concentration of dopant for boron in the monocrystalline silicon carbide is controlled by adjusting the temperature of the organic boron compound.

15. The process according to claim 6 wherein the boron trialkyl is selected from the group consisting of boron trimethyl, boron triethyl, boron tripropyl, boron tributyl and boron tripentyl.

16. The process according to claim 6 wherein the aromatic compound is boron triphenyl.

17. The process according to claim 15 wherein the aromatic compound is boron triphenyl.

* * * * *